(12) United States Patent
Chen et al.

(10) Patent No.: US 6,924,455 B1
(45) Date of Patent: Aug. 2, 2005

(54) INTEGRATED PLASMA CHAMBER AND INDUCTIVELY-COUPLED TOROIDAL PLASMA SOURCE

(75) Inventors: Xing Chen, Cambridge, MA (US); Donald K. Smith, Belmont, MA (US); William M. Holber, Winchester, MA (US)

(73) Assignee: Applied Science & Technology, Inc., Wilmington, MA (US)

( * ) Notice: Subject to any disclaimer, the term of this patent is extended or adjusted under 35 U.S.C. 154(b) by 612 days.

(21) Appl. No.: 09/774,165

(22) Filed: Jan. 26, 2001

Related U.S. Application Data

(63) Continuation-in-part of application No. 09/659,881, filed on Sep. 12, 2000, now Pat. No. 6,486,431, which is a continuation-in-part of application No. 08/883,281, filed on Jun. 26, 1997, now Pat. No. 6,150,628.

(51) Int. Cl.[7] ............................................. B23K 10/00
(52) U.S. Cl. ........................ 219/121.41; 219/121.52; 219/121.43; 219/121.48; 219/121.54; 315/111.51; 204/298.31
(58) Field of Search ..................... 219/121.48, 121.36, 219/121.5, 121.52, 121.54, 121.57, 121.59; 315/111.51

(56) References Cited

U.S. PATENT DOCUMENTS

| | | |
|---|---|---|
| 2,981,902 A | 4/1961 | Familier ...................... 333/17 |
| 3,054,742 A | 9/1962 | Thonemann et al. |
| 3,109,801 A | 11/1963 | Thonemann |
| 3,278,384 A | 10/1966 | Lenard et al. |
| 3,343,022 A | 9/1967 | Eckert ......................... 313/63 |
| 3,433,705 A | 3/1969 | Cornish |
| 3,500,118 A | 3/1970 | Anderson |
| 3,509,500 A | 4/1970 | McNair et al. ............... 334/47 |
| 3,663,361 A | 5/1972 | Yoshikawa |
| 3,794,941 A | 2/1974 | Templin ....................... 333/17 |
| 3,906,405 A | 9/1975 | Kommrusch .................. 333/17 |
| 3,987,334 A | 10/1976 | Anderson |

(Continued)

FOREIGN PATENT DOCUMENTS

| | | |
|---|---|---|
| DE | 39 42 560 C2 | 5/1996 |
| JP | 61-1024 | 1/1986 |
| JP | 02260399 | 10/1990 |
| JP | 5-166595 | 7/1993 |
| RU | 2022917 | 11/1994 |
| RU | 2056702 | 3/1996 |
| RU | 2094961 | 10/1997 |
| SU | 957744 A1 | 2/1996 |
| WO | WO90/10945 | 9/1990 |

OTHER PUBLICATIONS

Heckman et al., Advanced Energy Marketing Materials, "The Evolution of RF Power Delivery in Plasma Processing," (Copyright 1998) pp. 1–8.

(Continued)

Primary Examiner—Mark Paschall
(74) Attorney, Agent, or Firm—Prokauer Rose LLP

(57) ABSTRACT

A material processing apparatus having an integrated toroidal plasma source is described. The material processing apparatus includes a plasma chamber that comprises a portion of an outer surface of a process chamber. A transformer having a magnetic core surrounds a portion of the plasma chamber. The transformer has a primary winding. A solid state AC switching power supply comprising one or more switching semiconductor devices is coupled to a voltage supply and has an output that is coupled to the primary winding. The solid state AC switching power supply drives an AC current in the primary winding that induces an AC potential inside the chamber that directly forms a toroidal plasma that completes a secondary circuit of the transformer and dissociates the gas.

51 Claims, 7 Drawing Sheets

U.S. PATENT DOCUMENTS

| | | |
|---|---|---|
| 4,057,462 A | 11/1977 | Jassby et al. |
| 4,073,680 A | 2/1978 | Kelley |
| 4,088,926 A | 5/1978 | Fletcher et al. |
| 4,095,198 A | 6/1978 | Kirby .......................... 333/32 |
| 4,110,595 A | 8/1978 | Brambilla et al. |
| 4,180,763 A | 12/1979 | Anderson |
| 4,201,960 A | 5/1980 | Skutta et al. ................. 333/17 |
| 4,252,609 A | 2/1981 | Kerst et al. |
| 4,263,096 A | 4/1981 | Ohkawa et al. |
| 4,282,267 A | 8/1981 | Kuyel |
| 4,292,125 A | 9/1981 | Bers |
| 4,368,092 A | 1/1983 | Steinberg et al. |
| 4,431,898 A | 2/1984 | Reinberg et al. ...... 219/121 PG |
| 4,431,901 A | 2/1984 | Hull .......................... 219/121 |
| 4,486,722 A | 12/1984 | Landt .......................... 333/17 |
| 4,486,723 A | 12/1984 | Lysobey ..................... 333/17 |
| 4,601,871 A | 7/1986 | Turner |
| 4,626,400 A | 12/1986 | Jassby et al. |
| H268 H | 5/1987 | Owen |
| 4,679,007 A | 7/1987 | Reese et al. |
| 4,689,192 A | 8/1987 | Nagata |
| 4,732,761 A | 3/1988 | Machida et al. |
| 4,735,765 A | 4/1988 | Harris et al. |
| 4,748,383 A | 5/1988 | Houkes |
| 4,767,590 A | 8/1988 | Stix et al. |
| 4,780,803 A | 10/1988 | Dede Garcia-Santamaria |
| 4,786,352 A | 11/1988 | Benzing |
| H554 H | 12/1988 | Dawson et al. |
| 4,794,217 A | 12/1988 | Quan et al. |
| 4,859,399 A | 8/1989 | Bussard |
| 4,861,622 A | 8/1989 | Yamazaki et al. |
| 4,863,671 A | 9/1989 | Okada |
| 4,877,757 A | 10/1989 | York et al. |
| 4,878,149 A | 10/1989 | Stiehl et al. ................. 361/230 |
| 4,908,492 A | 3/1990 | Okamoto et al. |
| 4,918,031 A | 4/1990 | Flamm et al. |
| 4,985,113 A | 1/1991 | Fujimoto et al. |
| 4,996,077 A | 2/1991 | Moslehi et al. |
| 5,030,889 A | 7/1991 | El-Hamamsy et al. |
| 5,061,838 A | 10/1991 | Lane et al. |
| 5,130,003 A | 7/1992 | Conrad |
| 5,153,484 A | 10/1992 | El-Hamamsy |
| 5,187,454 A | 2/1993 | Collins et al. |
| 5,200,595 A | 4/1993 | Boulos et al. |
| 5,254,830 A | 10/1993 | Zarowin et al. |
| 5,277,751 A | 1/1994 | Ogle .......................... 156/643 |
| 5,290,382 A | 3/1994 | Zarowin et al. ............. 156/345 |
| 5,303,139 A | 4/1994 | Mark |
| 5,336,355 A | 8/1994 | Zarowin et al. |
| 5,346,578 A | 9/1994 | Benzing et al. ............. 156/345 |
| 5,364,600 A | 11/1994 | Stiehl et al. ........... 422/186.07 |
| 5,401,350 A | 3/1995 | Patrick et al. ............... 156/345 |
| 5,405,480 A | 4/1995 | Benzing et al. ............. 156/345 |
| 5,406,177 A | 4/1995 | Nerone |
| 5,414,238 A | 5/1995 | Steigerwald et al. ... 219/121.54 |
| 5,430,355 A | 7/1995 | Paranjpe ................ 315/111.21 |
| 5,440,206 A | 8/1995 | Kurono et al. |
| 5,458,732 A | 10/1995 | Butler et al. .................. 216/61 |
| 5,460,689 A | 10/1995 | Raaijmakers et al. |
| 5,468,296 A | 11/1995 | Patrick et al. ............... 118/723 |
| 5,472,561 A | 12/1995 | Williams et al. .......... 156/627.1 |
| 5,474,648 A | 12/1995 | Patrick et al. ............ 156/627.1 |
| 5,479,072 A | 12/1995 | Dakin et al. ................. 313/638 |
| 5,505,780 A | 4/1996 | Dalvie et al. |
| 5,506,507 A | 4/1996 | Schwierzke et al. ........ 324/464 |
| 5,514,246 A | 5/1996 | Blalock .................... 156/643.1 |
| 5,556,549 A | 9/1996 | Patrick et al. |
| 5,565,247 A | 10/1996 | Suzuki |
| 5,573,595 A | 11/1996 | Dible ................. 118/723 MP |
| 5,576,629 A | 11/1996 | Turner et al. |
| 5,618,382 A | 4/1997 | Mintz et al. ................... 216/64 |
| 5,630,880 A | 5/1997 | Eastlund |
| 5,643,364 A | 7/1997 | Zhao et al. ................. 118/723 |
| 5,654,679 A | 8/1997 | Mavretic et al. |
| 5,670,881 A | 9/1997 | Arakawa et al. ............ 324/322 |
| 5,712,592 A | 1/1998 | Stimson et al. |
| 5,747,935 A | 5/1998 | Porter et al. |
| 5,756,400 A | 5/1998 | Ye et al. |
| 5,773,919 A | 6/1998 | Seward |
| 5,811,022 A | 9/1998 | Savas et al. |
| 5,939,886 A | 8/1999 | Turner et al. |
| 5,998,933 A | 12/1999 | Shun'ko |
| 6,007,879 A | 12/1999 | Scholl |
| 6,164,241 A | 12/2000 | Chen et al. |
| 6,253,704 B1 | 7/2001 | Savas |
| 6,424,232 B1 | 7/2002 | Mavretic et al. ........... 333/17.3 |
| 6,459,066 B1 | 10/2002 | Khater et al. .......... 219/121.41 |

OTHER PUBLICATIONS

Advanced Energy Marketing Materials, "Introducing Power Supplies and Plasma Systems," (Copyright 1992) pp. 1–8.

Advanced Energy Marketing Materials, "Impedance Matching," (Copyright 1992) pp. 1–8.

Advanced Energy Industries, Inc., Presentation "Advances in 13.56 MHz Applications" by Knipp (date unknown) pp. 1–32.

*CRC Handbook of Chemistry and Physics* (1979–1980) pp. E–60.

Eckert, "The Hundred Year History of Induction Discharges," *Proceedings of The Second Annual International Conference of Plasma Chemistry and Technology* (Nov. 12–13, 1984) pp 171–202.

Foutz, "Switching–Mode Power Supply Design" (Jan. 17, 2001) pp. 1–3.

Gale et al., "Characterization of a Micromachined Electrical Field–Flow Fractionation ($\mu$EFFF) System" (no date) pp. 1–6.

"An Intelligent Solution to RF Load–Power Variability," vol. 2, No. 3, $3^{rd}$ Quarter (1995) pp. 1–8.

Lenk, "Switching Power–Supply Basics," *Simplified Design of Switching Power Supplies* (1995) pp. 1.

"Linear Circuit Analysis," *Electrical Engineering Handbook*, (Copyright 1993) pp. 85.

Massey, "Fabric antennas for mobile telephony integrated within clothing" (no date) pp. 1–4.

Memorandum Opinion, US District Court for the District of Delaware dated Feb. 12, 2004.

Order, US District Court for the District of Delaware dated Feb. 12, 2004.

Pressman, *Switching Power Supply Design*, (no date) pp. xvii.

"Principals and Techniques," *Electrical Engineers' Handbook*, (Copyright 1997) pp. 3.40–3.41.

*Remote Plasma Source* Chapter 2, (Mar. 2001) pp. 2–1–2–6.

Ulanov et al., "Study of the Transformer–Coupled Induction Toroidal Discharge for Development of Plasma–Chemical Reactors and New Light Sources," (date unknown) pp. 1–19.

Talanov et al., "Measurement of the absolute penetration depth and surface resistance of superconductors and normal metals with the variable parallel plate resonator," *Review of Scientific Instruments*, vol. 71, No. 5 (May 2000) pp. 2136–2146.

S.V. Dresvin, Physics & Tech. of Low Temp. Plasmas, H. Eckert ed, p. 234 (1977).

H.U. Eckert, "Analysis of Thermal Induction Plasmas between Coaxial Cylinders" *J. Appl. Phys.* 43(1):46–52 (1972).

H.U. Eckert, "An Electrodeless Discharge at 60 Hz" *IEEE Trans. on Plasma Sci.* PS–2:308–309 (1974).

H.U. Eckert, "The Induction Arc: A State–of–the–Art Review" *High Temp. Sci.* 6:99–134 (1974).

H.U. Eckert, "Induction Plasmas at Low Frequencies" *AIAA Journal* 9(8):1452–1456 (1971).

V.M. Gol'dfarb et al., "Properties of a Low–Frequency Discharge in a Transformer Plasmatron" *Teplofizika Vysokikh Temperatur* 17(4):698–702 (1979).

E. Kandler et al., "Characterization of Plasma in an Inductively Coupled High–Dense Plasma Source" *Surface Coartings & Tech.* 74 75:539–545 (1995).

V.A. Kogan et al., "Investigation of the Prospect for the Design of Transformer–Type Plasmotrons" *Teplofizika Vysokikh Temperatur* 31(1):105–110 (1993).

R.A. Krakowski et al., "Prospects for Using Low–Frequency Induction Plasmas for Bulk–Chemical Processing: A Systems Analysis" First INEL Workshop on Plasma Applications to Waste Treatment, Idaho Fall, Idaho, Jan. 16–17, 1991.

G. Soucy et al., "Parametric Study of the Decomposition of $NH_3$ for an Induction Plasma Reactor Design" *Plasma Chem. and Plasma Proc.* 15(4):693–710 (1995).

T.B. Reed, "Induction–Coupled Plasma Torch" *J. Appl. Phys.* 32(5):821–824 (1961).

T.B. Reed, "Growth of Refractory Crystals Using the Induction Plasma Torch" *J. Appl. Phys.* 32(12)2534–2535 (1961).

T.B. Reed, "Heat–Transfer Intensity from Induction Plasma Flames and Oxy–Hydrogen Flames" J. Appl. Phys. 34(8)2266–2269 (1963).

T.B. Reed, "High–Power Low–Density Induction Plasmas" *Communications* 3146–3147 (1963).

F. Maier, "Electronic Circuits for the Generation and Transfer of High–Power Pulses in Nuclear Fusion Installations" *IEEE Transactions on Plasma Science* PS–12(3): 191–198 (1984).

International Search Report dated Nov. 5, 1998 in corresponding PCT Application No. PCT/US98/13155.

Osram Endura 150W Product Information Brochure, Nov. 1996, pp. 1–4.

Hiramatsu et al., "Generation of Strongly Ionized Aluminum Plasma in a Low–Temperature Tokamak Discharge," *Japanese Journal of Applied Physics*, vol. 31 (Jul. 1992) pp. 2243–2248.

Zhang et al., "A High Power Radio Frequency Transformer for Plasma Production in a Toroidal Plasma Source," *Rev. Sci. Instrum.*, vol. 69 (Jan. 1998) pp. 101–108.

Hirose et al., "STOR II A Tokamak for Plasma Heating Studies," Plasma Physics Laboratory, University of Saskatchewan, Apr. 1981, pp. 11–14.

Osram ECG–SPOT Brochure, Feb. 1997, pp. 1–12.

Cayless et al., "Lamps and Lighting," Third Edition, pp. 280–286.

"International Lighting Review, Induction Lighting," *The Global Lighting Magazine*, Apr. 1996.

"The Advanced Energy PE 2500 W, 100 kHz Generator with Load Matching User Manual," Sep. 1989.

Kassakian et al., *Principles of Power Electronics*, 1991, Chapter 1, pp. 1–8.

Lieberman et al., *Principles of Plasma Discharges and Material Processing*; Chapter 12 "Inductive Discharges," pp. 387–389.

Benesch, *Breakdown in the Pretext Tokamak*, "Chapter Two—The Machine," Jun. 1981, pp. 15–16.

Kogan et al., "Research into Potential for Creating Transformer Type Plasmatrons," *Teplofizika Vysokikh Temperatur*, vol. 31, No. 1, 1993, pp. 1–8.

Complaint for Declaratory Judgment of Non–Infringement, filed in the United States District Court for the District of Colorado, by Advanced Energy Industries, Inc., dated Apr. 3, 2003.

Complaint, filed in the United States District Court for the District of Delaware, by MKS Instruments, Inc. and Applied Science and Technology, Inc., dated May 14, 2003.

Answer, filed in the United States District Court for the District of Delaware, by Advanced Energy Industries, Inc., dated Dec. 10, 2003.

Amended Complain and Jury Demand, filed in the United States District Court for the District of Colorado, by Advanced Energy Industries, Inc., dated Dec. 15, 2003.

INTEGRATED PLASMA CHAMBER AND INDUCTIVELY-COUPLED TOROIDAL PLASMA SOURCE

RELATED APPLICATIONS

This is a continuation-in-part of patent application Ser. No. 09/659,881, filed on Sep. 12, 2000 now U.S. Pat. No. 6,486,431, which is a continuation of U.S. Ser. No. 08/883,281 now U.S. Pat. No. 6,150,628, filed on Jun. 26, 1997, the entire disclosure of which is incorporated herein by reference.

FIELD OF THE INVENTION

This invention relates generally to the field of generating activated gas containing ions, free radicals, atoms and molecules and to apparatus for and methods of processing materials with activated gas.

BACKGROUND OF THE INVENTION

Plasma discharges can be used to excite gases to produce activated gases containing ions, free radicals, atoms and molecules. Activated gases are used for numerous industrial and scientific applications including processing solid materials such as semiconductor wafers, powders, and other gases. The parameters of the plasma and the conditions of the exposure of the plasma to the material being processed vary widely depending on the application.

For example, some applications require the use of ions with low kinetic energy (i.e. a few electron volts) because the material being processed is sensitive to damage. Other applications, such as anisotropic etching or planarized dielectric deposition, require the use of ions with high kinetic energy. Still other applications, such as reactive ion beam etching, require precise control of the ion energy.

Some applications require direct exposure of the material being processed to a high density plasma. One such application is generating ion-activated chemical reactions. Other such applications include etching of and depositing material into high aspect ratio structures. Other applications require shielding the material being processed from the plasma because the material is sensitive to damage caused by ions or because the process has high selectivity requirements.

Plasmas can be generated in various ways including DC discharge, radio frequency (RF) discharge, and microwave discharge. DC discharges are achieved by applying a potential between two electrodes in a gas. RF discharges are achieved either by electrostatically or inductively coupling energy from a power supply into a plasma. Parallel plates are typically used for electrostatically coupling energy into a plasma. Induction coils are typically used for inducing current into the plasma Microwave discharges are achieved by directly coupling microwave energy through a microwavepassing window into a discharge chamber containing a gas. Microwave discharges are advantageous because they can be used to support a wide range of discharge conditions, including highly ionized electron cyclotron resonant (ECR) plasmas.

RF, DC and microwave discharges are often used to generate plasmas for applications where the material being processed is in direct contact with the plasma. In addition, microwave and rf discharges are often used to produce streams of activated gas for "downstream" processing.

However, microwave and inductively coupled plasma sources require expensive and complex power delivery systems. These plasma sources require precision RF or microwave power generators and complex matching networks to match the impedance of the generator to the plasma source. In addition, precision instrumentation is usually required to ascertain and control the actual power reaching the plasma.

RF inductively coupled plasmas are particularly useful for generating large area plasmas for such applications as semiconductor wafer processing. However, prior art RF inductively coupled plasmas are not purely inductive because the drive currents are only weakly coupled to the plasma. Consequently, RF inductively coupled plasmas are inefficient and require the use of high voltages on the drive coils. The high voltages produce high electrostatic fields that cause high energy ion bombardment of reactor surfaces. The ion bombardment causes deterioration of the reactor and can contaminate the process chamber and the material being processed. The ion bombardment can also cause damage to the material being processed.

Faraday shields have been used in inductively coupled plasma sources to shield the high electrostatic fields. However, because of the relatively weak coupling of the drive coil currents to the plasma, large eddy currents form in the shields resulting in substantial power dissipation. The cost, complexity, and reduced power efficiency make the use of Faraday shields unattractive.

SUMMARY OF THE INVENTION

One embodiment of the invention is a material processing apparatus having an integrated toroidal plasma source. Another embodiment of the invention is a process chamber having an integrated toroidal plasma source for cleaning the chamber. The integrated plasma source uses a high efficiency RF power coupling device which couples power into a plasma without the use of conventional RF or microwave generators and impedance matching systems. Switching semiconductor devices are used to efficiently drive the primary winding of a power transformer that couples electromagnetic energy to a plasma so as to form a secondary circuit of the transformer.

The integrated toroidal plasma source of the present invention has numerous advantages. The integrated source can provide a combination of plasma and reactive species to the process chamber. The integrated source has relatively high efficiency. It can operate at relatively high process rates or with reduced gas usage. The integrated source can thus reduce hazardous waste exhaust gases and cost of operation. Also, the integrated source can be constructed with a metallic plasma chamber. In addition, the integrated source is relatively compact and inexpensive.

Accordingly, the present invention features a material processing apparatus that includes a process chamber. The process chamber has a sample holder positioned inside the process chamber that supports material to be processed. A power supply may be electrically coupled to the sample holder to bias the material to be processed relative to a potential of the plasma.

The apparatus also includes a plasma chamber comprising a portion of an outer surface of the process chamber. The plasma chamber may comprise a portion of a top surface of the process chamber. The plasma chamber may be formed from a metallic material such as aluminum or may be formed from a dielectric material such as quartz. The metallic material may be a refractory metal.

A transformer having a magnetic core surrounds a portion of the plasma chamber. A portion of the magnetic core may be positioned within the process chamber. The transformer has a primary winding. A solid state AC switching power supply comprising one or more switching semiconductor devices is coupled to a voltage supply and has an output coupled to the primary winding. The solid state AC switching power supply drives an AC current in the primary winding that induces an AC potential inside the chamber that directly forms a toroidal plasma that completes a secondary circuit of the transformer and dissociates the gas.

The apparatus may include a free charge generator, which assists the ignition of the plasma in the chamber. In one embodiment, an electrode is positioned in the chamber to generate the free charges. In another embodiment, an electrode is capacitively coupled to the chamber to generate the free charges. In another embodiment, an ultraviolet light source is optically coupled to the chamber to generate the free charges.

The apparatus may include a circuit for measuring electrical parameters of the primary winding and of the plasma. The circuit measures parameters such as the current driving the primary winding, the voltage across the primary winding, the bus supply voltage, the average power in the primary winding, and the peak power in the primary winding. A power control circuit may be coupled to the circuit for measuring electrical parameters of the primary winding and the plasma. The power control circuit regulates the current flowing through the primary windings based upon a measurement of the electrical properties of the primary winding and of the plasma and from a predetermined set point representing a desired operating condition.

The present invention also features a process chamber having integrated chamber cleaning apparatus. The process chamber includes a plasma chamber comprising a portion of an outer surface of the process chamber. The plasma chamber may be formed from a metallic material such as aluminum or may be formed from a dielectric material such as quartz. The metallic material may be a refractory metal.

A transformer having a magnetic core surrounds a portion of the plasma chamber. A portion of the magnetic core may be positioned within the process chamber. The transformer has a primary winding. A solid state AC switching power supply comprising one or more switching semiconductor devices is coupled to a voltage supply and has an output coupled to the primary winding. The solid state AC switching power supply drives an AC current in the primary winding that induces an AC potential inside the chamber that directly forms a toroidal plasma that completes a secondary circuit of the transformer and dissociates the gas.

The apparatus may include a free charge generator, which assists the ignition of the plasma in the chamber. In another embodiment, an electrode is positioned in the chamber to generate the free charges. In another embodiment, an electrode is capacitively coupled to the chamber to generate the free charges. In another embodiment, an ultraviolet light source is optically coupled to the chamber to generate the free charges.

The apparatus may include a circuit for measuring electrical parameters of the primary winding and of the plasma. The circuit measures parameters such as the current driving the primary winding, the voltage across the primary winding, the bus supply voltage, the average power in the primary winding, and the peak power in the primary winding. A power control circuit may be coupled to the circuit for measuring electrical parameters of the primary winding and the plasma. The power control circuit regulates the current flowing through the primary windings based upon a measurement of the electrical properties of the primary winding and of the plasma and from a predetermined set point representing a desired operating condition.

The present invention also features a method for delivering reactive neutral species to a process chamber. The method includes confining a gas in a plasma chamber comprising a portion of the outer surface of the process chamber. A current is generated with a solid state AC switching power supply. An AC potential is induced inside the plasma chamber by passing the current though a primary winding of a transformer having a magnetic core surrounding a portion of the chamber. The induced AC potential directly forms a toroidal plasma that completes a secondary circuit of the transformer and dissociates the gas. The dissociated gas is then directed into the process chamber. The dissociated gas may be directed to material to be processed or may be used to clean the process chamber.

In one embodiment, the method includes providing an initial ionization event in the plasma chamber. The initial ionization event can be provided in numerous ways. For example, the initial ionization event can be provided by applying a voltage pulse to the primary winding. The initial ionization event can also be provided by exposing the chamber to ultraviolet light. In addition, the initial ionization event can be provided by positioning an electrode in the chamber and energizing the electrode to generate free charges. Furthermore, the initial ionization event can be provided by capacitively coupling energy into the chamber to generate the free charges. In one embodiment, the method include measuring electrical parameters including at least one of the current passing though the primary winding, a voltage across the primary winding, an average power in the primary winding, and a peak power in the primary winding. The magnitude of the current generated by the solid state AC switching power supply may be adjusted in response to the measured electrical parameters and from predetermined operating conditions.

BRIEF DESCRIPTION OF THE DRAWINGS

This invention is described with particularity in the appended claims. The above and further advantages of this invention may be better understood by referring to the following description taken in conjunction with the accompanying drawings, in which:

DETAILED DESCRIPTION

Figure 1:
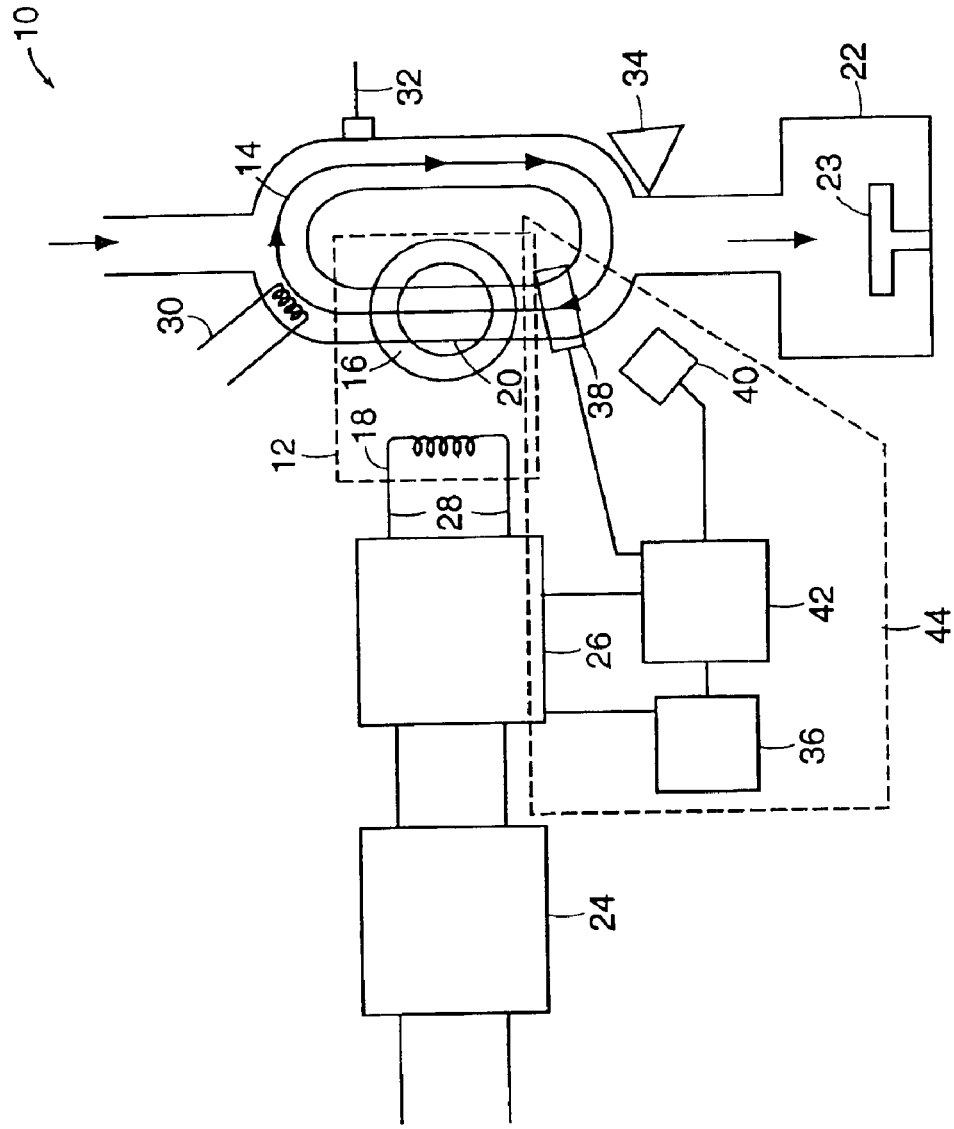
FIG. 1 is a schematic representation of a toroidal low-field plasma source for producing activated gases that embodies the invention.

FIG. 1 is a schematic representation of a toroidal low-field plasma source 10 for producing activated gases that embodies the invention. The source 10 includes a power transformer 12 that couples electromagnetic energy into a plasma 14. The power transformer 12 includes a high permeability magnetic core 16, a primary coil 18, and a plasma chamber 20 which allows the plasma 14 to form a secondary circuit of the transformer 12. The power transformer 12 can include additional magnetic cores and conductor primary coils (not shown) that form additional secondary circuits.

The plasma chamber 20 may be formed from a metallic material such as aluminum or a refractory metal, or may be formed from a dielectric material such as quartz. One or more sides of the plasma chamber 20 may be exposed to a process chamber 22 to allow charged particles generated by the plasma 14 to be in direct contact with a material to be processed (not shown). A sample holder 23 may be positioned in the process chamber 22 to support the material to be processed. The material to be processed may be biased relative to the potential of the plasma.

A voltage supply 24, which may be a line voltage supply or a bus voltage supply, is directly coupled to a circuit 26 containing one or more switching semiconductor devices. The one or more switching semiconductor devices may be switching transistors. The circuit may be a solid state switching power supply. An output 28 of the circuit 26 may be directly coupled to the primary winding 18 of the transformer 12.

The toroidal low field plasma source 10 may include a means for generating free charges that provides an initial ionization event that ignites a plasma in the plasma chamber 20. The initial ionization event may be a high voltage pulse that is applied to the plasma chamber. In one embodiment, the pulse has a voltage of approximately 500–10,000 volts and is approximately 0.1 to 10 microseconds long. In another embodiment, longer pulses are used. Pulses having a duration ranging from a few seconds or less to approximately 40 seconds are used. A noble gas such as argon may be inserted into the plasma chamber 20 to reduce the voltage required to ignite a plasma. Ultraviolet radiation may also be used to generate the free charges in the plasma chamber 20 that provide the initial ionization event that ignites the plasma in the plasma chamber 20.

In a preferred embodiment, the short, high voltage electric pulse is applied directly to the primary coil 18 to provide the initial ionization event. In another preferred embodiment, the short, high voltage electric pulse is applied to an electrode 30 positioned in the plasma chamber 20. In another preferred embodiment, the short, high voltage electric pulse is applied to an electrode 32 that is capacitively coupled to the plasma chamber 20 by a dielectric. The frequency of pulses applied to the electrode 32 that is capacitively coupled to the plasma chamber 20 by a dielectric may be varied to increase the ignition voltage. In another preferred embodiment, the plasma chamber 20 is exposed to ultraviolet radiation emitting from an ultraviolet light source 34 that is optically coupled to the plasma chamber 20. The ultraviolet radiation causes the initial ionization event that ignites the plasma. In another preferred embodiment, the frequency of pulses applied to the electrode 32 is varied to causes the initial ionization event that ignites the plasma.

The toroidal low field plasma source 10 may also include a circuit 36 for measuring electrical parameters of the primary winding 18. Electrical parameters of the primary winding 18 include the current driving the primary winding 18, the voltage across the primary winding 18, the bus or line voltage supply generated by the voltage supply 24, the average power in the primary winding 18, and the peak power in the primary winding 18.

In addition, the plasma source 10 may include a means for measuring relevant electrical parameters of the plasma 14. Relevant electrical parameters of the plasma 14 include the plasma current and power. For example, the source 10 may include a current probe 38 positioned around the plasma chamber 20 to measure the plasma current flowing in secondary of the transformer 12. The plasma source 10 may also include an optical detector 40 for measuring the optical emission from the plasma 14. In addition, the plasma source 10 may include a power control circuit 42 that accepts data from one or more of the current probe 38, the power detector 40, and the circuit 26 and then adjusts the power in the plasma by adjusting the current in the primary winding 18.

In operation, a gas is bled into the plasma chamber 20 until a pressure substantially between 1 mtorr and 100 torr is reached. The gas may comprise a noble gas, a reactive gas or a mixture of at least one noble gas and at least one reactive gas. The circuit 26 containing switching semiconductor devices supplies a current to the primary winding 18 that induces a potential inside the plasma chamber. The magnitude of the induced potential depends on the magnetic field produced by the core and the frequency at which the switching semiconductor devices operate according to Faraday's law of induction. An ionization event that forms the plasma may be initiated in the chamber. The ionization event may be the application of a voltage pulse to the primary winding or to the electrode 30 in the chamber 20. Alternatively, the ionization event may be exposing the chamber to ultraviolet radiation.

Once the gas is ionized, a plasma is formed which completes a secondary circuit of the transformer. The electric field of the plasma may be substantially between 1–100 V/cm. If only noble gases are present in the plasma chamber 20, the electric fields in the plasma 14 may be as low as 1 volt/cm. If, however, electronegative gases are present in the chamber, the electric fields in the plasma 14 are considerably higher. Operating the plasma source 10 with low electric fields in the plasma chamber 14 is desirable because a low potential difference between the plasma and the chamber will substantially reduce erosion of the chamber by energetic ions and the resulting contamination to the material being processed.

The power delivered to the plasma can be accurately controlled by a feedback loop 44 that comprises the power control circuit 42, the circuit 36 for measuring electrical parameters of the primary winding 18 and the circuit 26 containing one or more switching semiconductor devices. In addition, the feedback loop 44 may include the current probe 38 and optical detector 40.

In a preferred embodiment, the power control circuit 42 measures the power in the plasma using the circuit 36 for measuring electrical parameters of the primary winding 18. The power control circuit 42 then compares the measurement to a predetermined setpoint representing a desired operating condition and adjusts one or more parameters of the circuit 26 to control the power delivered to the plasma. The one or more parameters of circuit 26 include pulse amplitude, frequency, pulse width, and relative phase of the drive pulses to the one or more switching semiconductor devices.

In another preferred embodiment, the power control circuit 42 measures the power in the plasma using the current probe 38 or the optical detector 40. The power control circuit 42 then compares the measurement to a predetermined setpoint representing a desired operating condition and adjusts one or more parameters of the circuit 26 to control the power delivered to the plasma.

The plasma source 10 is advantageous because its conversion efficiency of line power into power absorbed by the plasma is very high compared with prior art plasma sources. This is because the circuit 26 containing one or more switching semiconductor devices that supplies the current to the primary winding 18 is highly efficient. The conversion efficiency may be substantially greater than 90%. The plasma source 10 is also advantageous because it does not require the use of conventional impedance matching networks or conventional RF power generators. This greatly reduces the cost and increases the reliability of the plasma source.

In addition, the plasma source 10 is advantageous because it operates with low electric fields in the plasma chamber 20. Low electric fields are desirable because a low potential difference between the plasma and the chamber will substantially reduce energetic ion bombardment within the plasma chamber 20. Reducing energetic ion bombardment in the plasma chamber 20 is desirable because it minimizes the production of contaminating materials within the plasma chamber 20, especially when chemically reactive gases are used. For example, when fluorine based gases such as NF3 and CF4/O2 are used in the plasma source 10 of the present invention, including a plasma chamber formed from a fluorine resistant material, no or minimal erosion of the chamber was observed after extended exposure to the low ion temperature fluorine plasma.

The plasma source 10 is useful for processing numerous materials such as solid surfaces, powders, and gases. The plasma source 10 is particularly useful for cleaning process chambers in semiconductor processing equipment such as thin film deposition and etching systems. The plasma source 10 is also particularly useful for providing an ion source for ion implantation and ion milling systems.

In addition, the plasma source 10 is useful for providing a source for etching systems used for etching numerous materials used to fabricate semiconductor devices such as silicon, silicon dioxide, silicon nitride, aluminum, molybdenum, tungsten and organic materials such as photoresists, polyimades and other polymeric materials. The plasma source 10 is also useful for providing a source for plasma enhanced deposition of materials of numerous thin films such as diamond films, silicon dioxide, silicon nitride, and aluminum nitride.

The plasma source is also useful for generating reactive gases such as atomic fluorine, atomic chlorine, atomic hydrogen, atomic bromine and atomic oxygen. Such reactive gases are useful for reducing, converting, stabilizing or passivating various oxides such as silicon dioxide, tin oxide, zinc oxide and indium-tin oxide. Applications include fluxless soldering, removal of silicon dioxide from silicon surface, passivation of silicon surface prior to wafer processing, and cleaning of silicon surfaces prior to subsequent processing steps.

Other applications of the plasma source 10 include modification of surface properties of polymers, metals, ceramics and papers. The plasma source 10 may also be used for abatement of environmentally hazardous gases including fluorine containing compounds such as CF4, NF3, C2F6, CHF3, SF6, and organic compounds such as dioxins and furans and other volatile organic compounds. In addition, the plasma source 10 may be used to generate high fluxes of atomic oxygen, atomic chlorine, or atomic fluorine for sterilization. The plasma source 10 may also be used in an atmospheric pressure torch.

Figure 2:
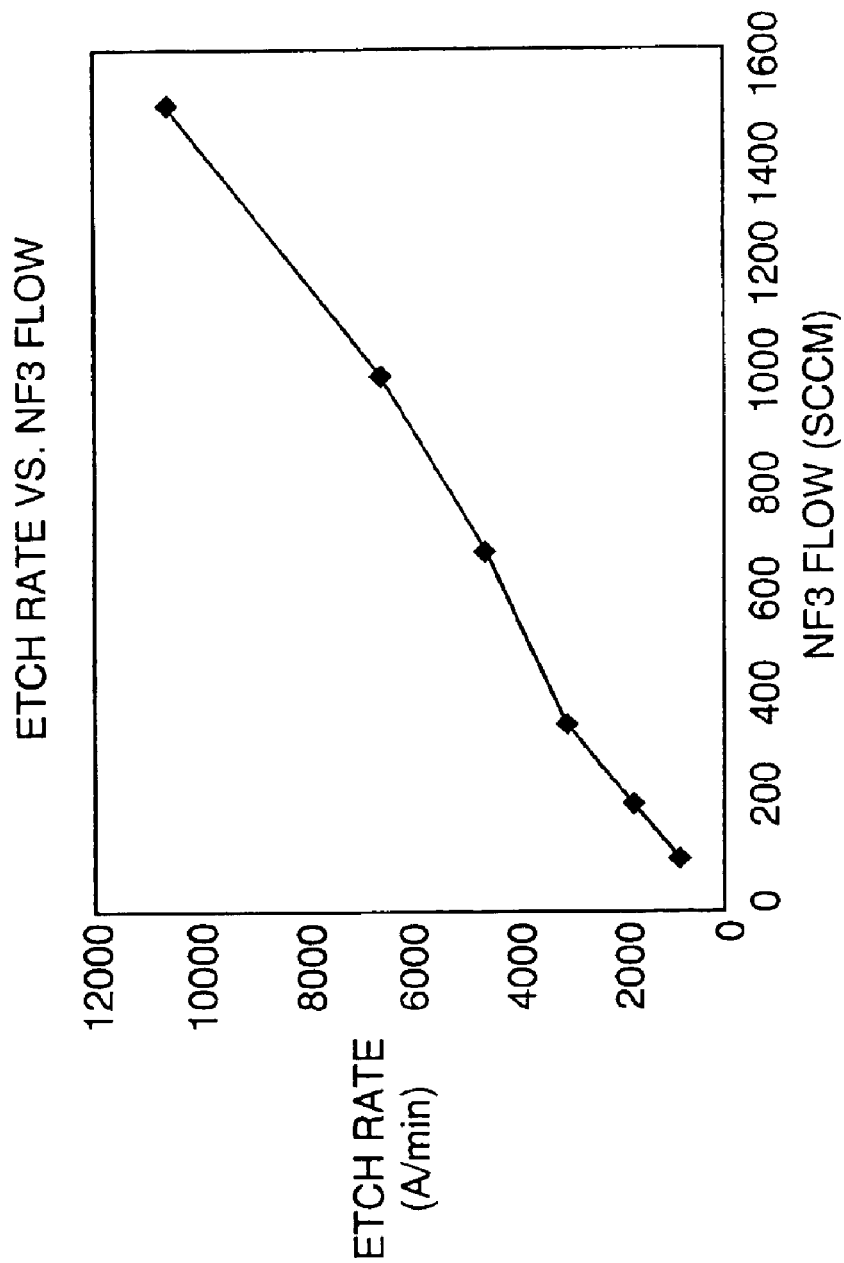
FIG. 2 illustrates a plot of etch rate of thermal silicon dioxide as a function of NF3 feed gas flow rate, using the toroidal low-field plasma source that embodies the invention.

FIG. 2 illustrates a plot of etch rate of thermal silicon dioxide as a function of NF3 feed gas flow rates using the toroidal low-field plasma source that embodies the invention. The toroidal low-field plasma source 10 was configured as a downstream atomic fluorine source. The power was approximately 3.5 kW.

Figure 3:
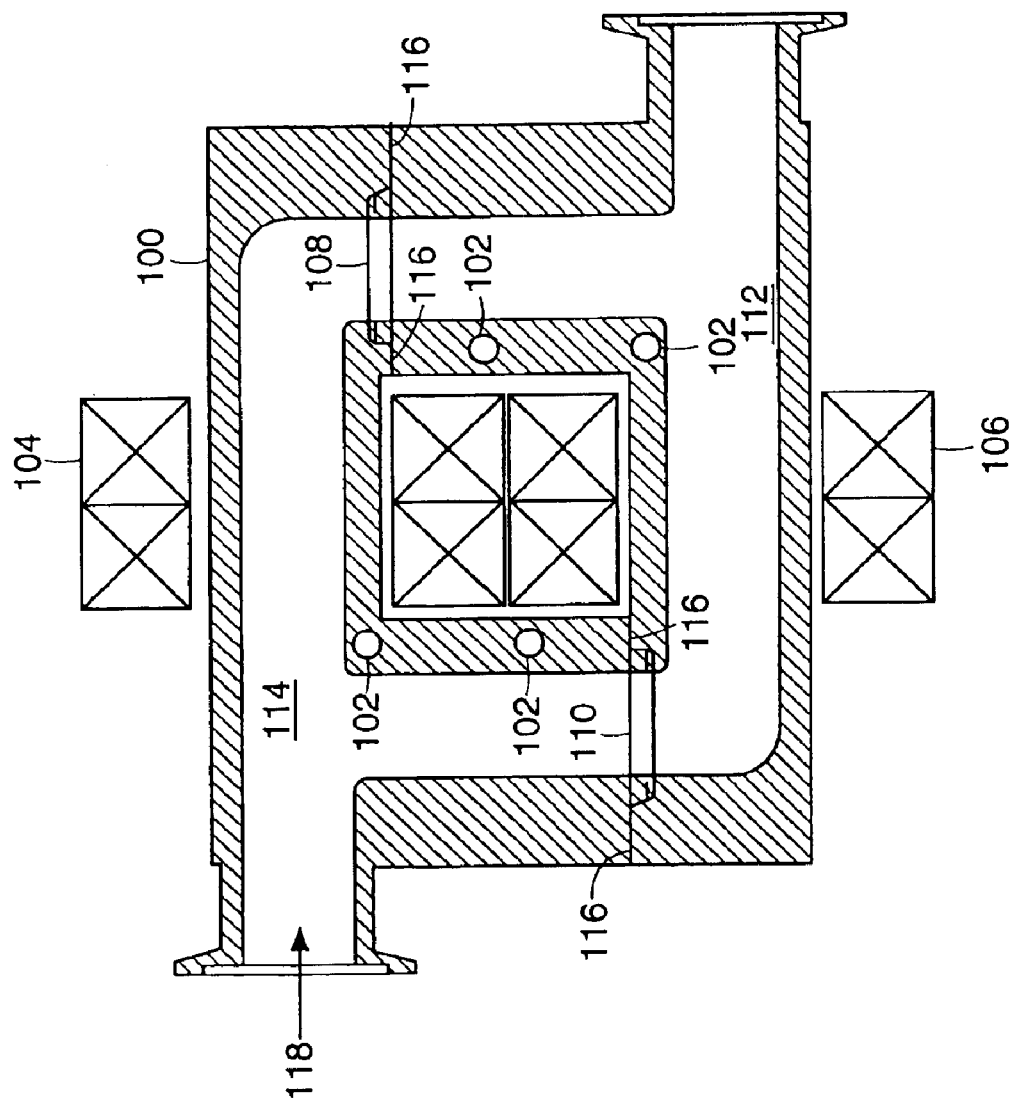
FIG. 3 is a schematic representation of a metallic plasma chamber that may be used with the toroidal low-field plasma source described in connection with FIG. 1.

FIG. 3 is a schematic representation of a metallic plasma chamber 100 that may be used with the toroidal low-field plasma source described in connection with FIG. 1. The plasma chamber 100 is formed from a metal such as aluminum, copper, nickel and steel. The plasma chamber 100 may also be formed from a coated metal such as anodized aluminum or nickel plated aluminum. The plasma chamber 100 includes imbedded cooling channels 102 for passing a fluid that controls the temperature of the plasma chamber 100.

As shown, a first 104 and a second high permeability magnetic core 106 surround the plasma chamber 100. The magnetic cores 104, 106 are part of the transformer 12 of FIG. 1. As described in connection with FIG. 1, each of the first 104 and the second core 106 induce a potential inside the chamber that forms a plasma which completes a secondary circuit of the transformer 12. Only one magnetic core is required to operate the toroidal low-field plasma source.

Applicants have discovered that an inductively-driven toroidal low-field plasma reactive gas source can be made with a metallic plasma chamber. Prior art inductively coupled plasma sources use plasma chambers formed from dielectric material so as to prevent induced current flow from forming in the plasma chamber itself. The plasma chamber 100 of this invention includes at least one dielectric region that electrically isolates a portion of the plasma chamber 100 so that electrical continuity through the plasma chamber 100 is broken. The electrical isolation prevents induced current flow from forming in the plasma chamber itself.

The plasma chamber 100 includes a first 108 and a second dielectric region 110 that prevents induced current flow from forming in the plasma chamber 100. The dielectric regions 108, 110 electrically isolate the plasma chamber 100 into a first 112 and a second region 114. Each of the first 112 and the second region 114 is joined with a high vacuum seal to the dielectric regions 108, 110 to form the plasma chamber 100. The high vacuum seal may be comprised of an elastomer seal or may be formed by a permanent seal such as a brazed joint. In order to reduce contamination, the dielectric regions 108, 110 may be protected from the plasma. The dielectric regions 108, 110 may comprise a dielectric spacer separating mating surface 116 of the plasma chamber 100, or may be a dielectric coating on the mating surface 116.

In operation, a feed gas flows into an inlet 118. As described in connection with FIG. 1, each of the first 104 and the second core 106 induce a potential inside the plasma chamber 100 that forms a plasma which completes a secondary circuit of the transformer 12. Note that only one magnetic core is required to operate the toroidal low-field plasma source.

The use of metal or coated metal chambers in toroidal low-field plasma sources is advantageous because some metals are more highly resistant to certain chemicals commonly used in plasma processing, such as fluorine based gases. In addition, metal or coated metal chambers may have much higher thermal conductivity at much higher temperatures than dielectric chambers and, therefore, can generate much higher power plasmas.

Figure 4:
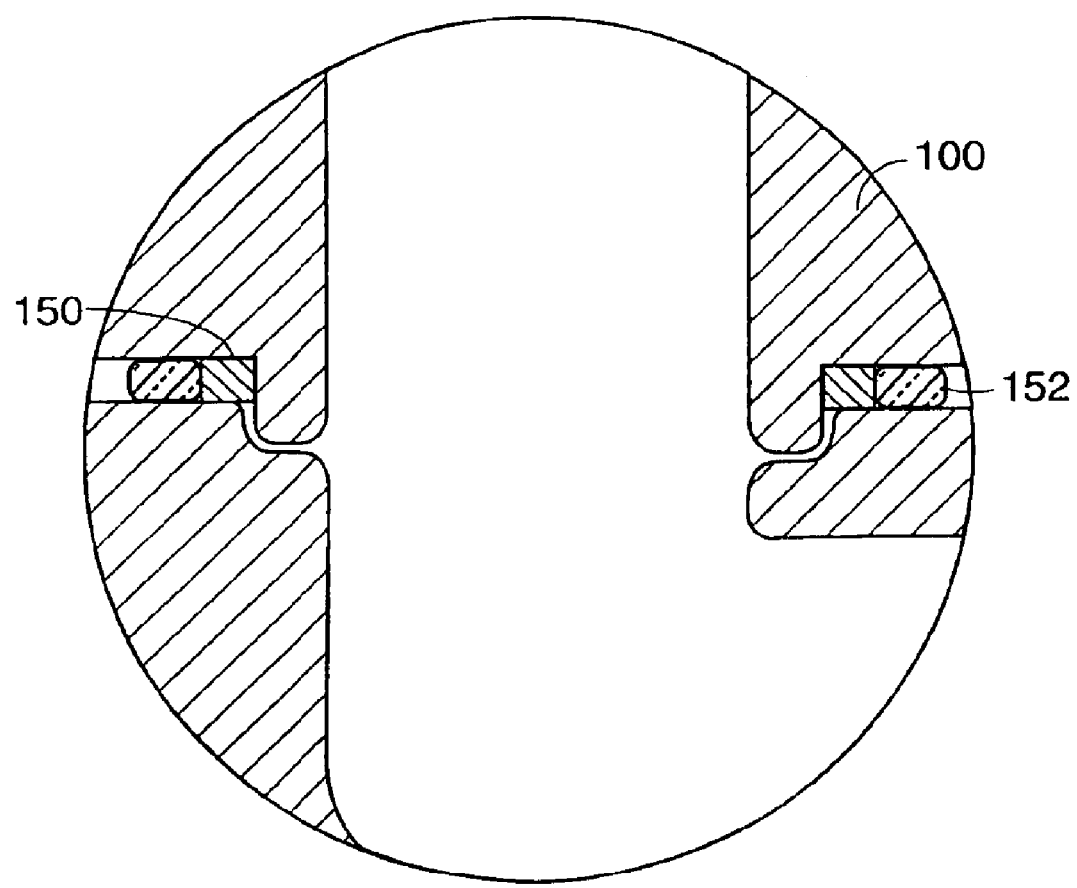
FIG. 4 is a schematic representation of a dielectric spacer suitable for the dielectric regions illustrated in FIG. 3 that prevent induced current flow from forming in the plasma chamber.

FIG. 4 is a schematic representation of a dielectric spacer 150 suitable for the dielectric regions illustrated in FIG. 3 that prevent induced current flow from forming in the plasma chamber. In this embodiment, a high vacuum seal 152 is formed outside the dielectric spacer 150. The dielectric region is protected from the plasma by protruded chamber wall 100.

Figure 5:
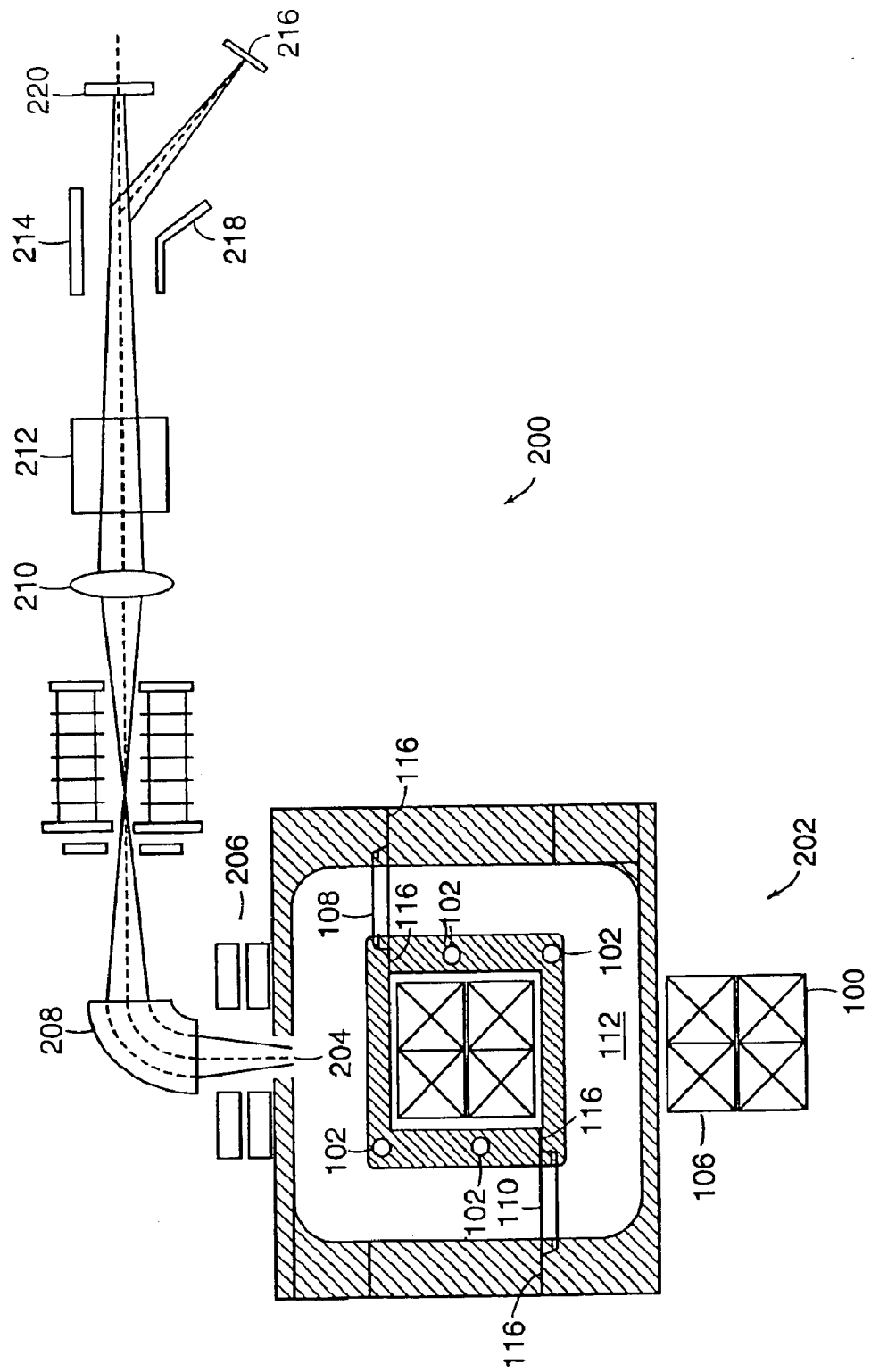
FIG. 5 is a schematic representation of a toroidal low-field ion beam source that embodies the invention and that is configured for high intensity ion beam processing.

FIG. 5 is a schematic representation of an ion beam source 200 including an toroidal low-field plasma generator that embodies the invention. The ion beam source 200 may be used for numerous ion beam processing applications including ion milling and ion implantation. The ion beam source 200 includes toroidal low field plasma source 202 comprising the metallic plasma chamber 100 described in connection with FIG. 3. The plasma chamber 100 includes a slit 204 for extracting ions generated by the plasma out of the chamber 100. Accelerating electrodes 206 accelerate the ions passing out of the chamber 100 with a predetermined electric field thereby forming an ion beam where the ions have a predetermined energy.

A mass-separating magnet 208 may be positioned in the path of the accelerated ions to select a desired ion species. A second set of accelerating electrodes may be used to accelerate the desired ion species to a predetermined high energy. An ion lens may be used to focus the high energy ion beam. A vertical 212 and a horizontal axis scanner 214 may be used to scan the ion beam across a sample 216. A deflector 218 may be used to separate the ion beam from any neutral particles so that the ion beam impacts the sample 216 and the neutral particles impact a neutral trap 220.

Figure 6:
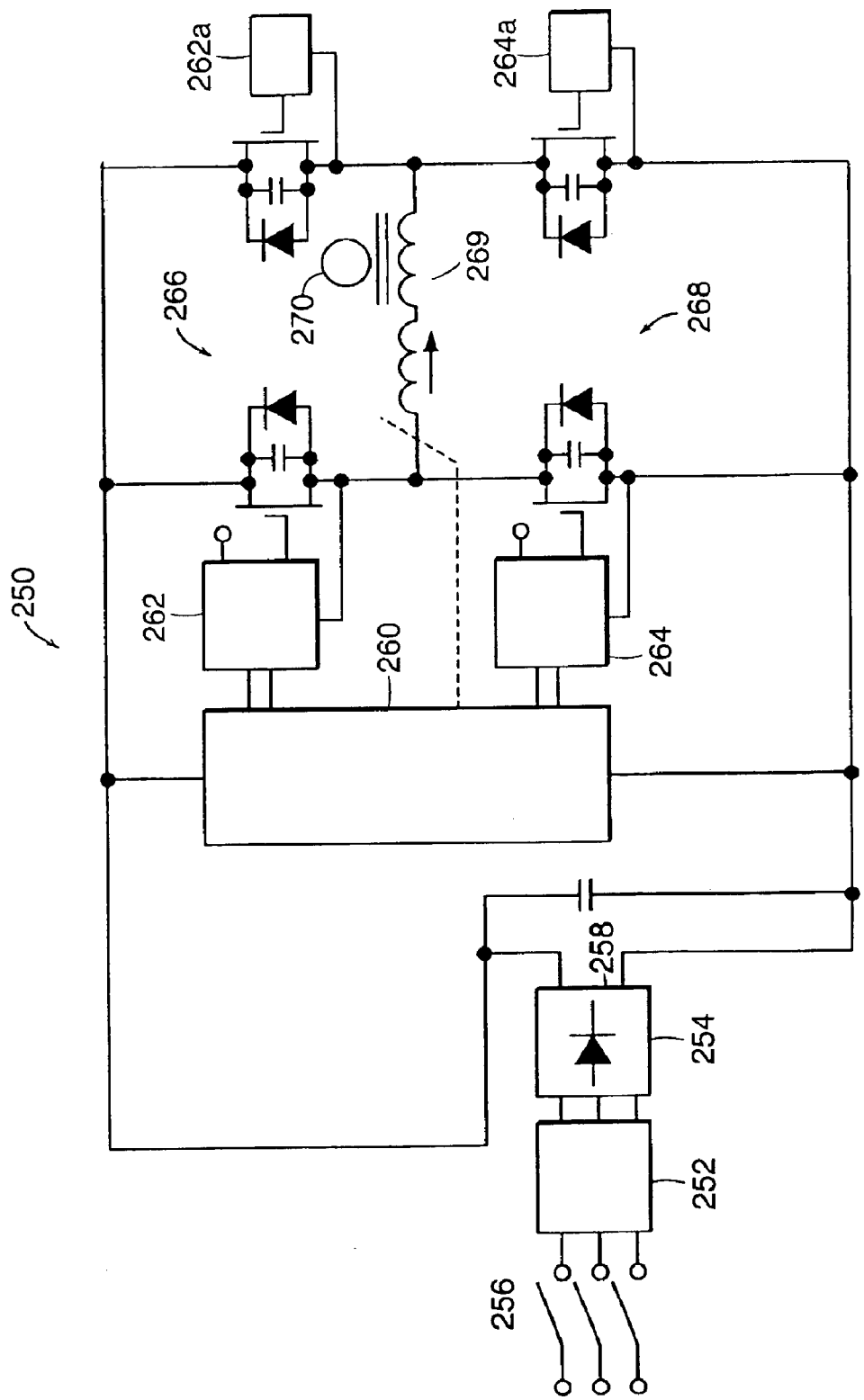
FIG. 6 is a schematic block diagram of a solid state switching power supply that includes the one or more switching semiconductor devices of FIG. 1.

FIG. 6 is a schematic block diagram of a solid state switching power supply 250 that includes the one or more switching semiconductor devices of FIG. 1. Applicants have discovered that switching semiconductor devices can be used to drive the primary winding of a power transformer that couples electromagnetic energy to a plasma so as to form a secondary circuit of the transformer.

The use of a switching power supply in toroidal low-field plasma source is advantageous because switching power supplies are much less expensive and are physically much smaller in volume and lighter in weight than the prior art RF and microwave power supplies used to power plasma sources. This is because switching power supplies do not require a line isolation circuit or an impedance matching network.

The present invention can use any switching power supply configuration to drive current in the primary winding 18 (FIG. 1). For example, the switching power supply 250 may include a filter 252 and a rectifier circuit 254 that is coupled to a line voltage supply 256. An output 258 of the filter 252 and the rectifier circuit 254 produces a DC voltage which is typically several hundred volts. The output 258 is coupled to a current mode control circuit 260.

The current mode control circuit 260 is coupled to a first 262, 262a and a second isolation driver 264, 264a. The first 262, 262a and the second isolation driver 264, 264a drives a first 266 and a second pair of switching transistors 268. The switching transistors may be IGBT or FET devices. The output of the first 266 and the second pair of switching transistors 268 may have numerous waveforms including a sinusoidal waveform. The output of the switching transistors is coupled by the primary winding and magnetic core 269 to the toroidal plasma 270, which forms the transformer secondary.

Another aspect of the present invention is that an apparatus for dissociating and activating gases according to the present invention can be integrated directly into a surface of the plasma chamber, such as the lid of the plasma chamber. Such a source can be used to provide reactive neutral species, such as O, F, H, N, Cl, and Br, directly to a process chamber without having to pass the reactive neutral species though an intermediate region. Such a source can also deliver a plasma to the process chamber. The integrated source provides more efficient transport of reactive neutral species into the process chamber.

Figure 7A:
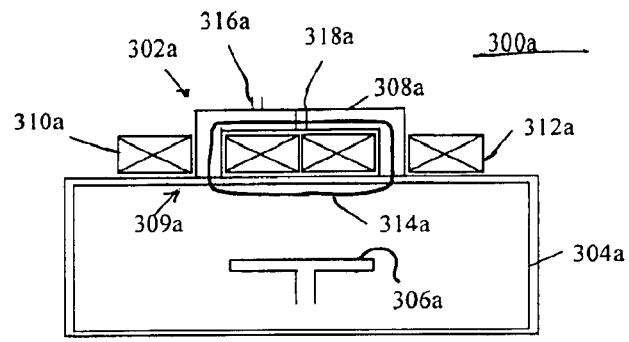
FIG. 7a though 7d are schematic cross-sectional representations of embodiments of a material processing apparatus according to the present invention.

FIG. 7a though 7d are schematic cross-sectional representations of embodiments of a material processing apparatus 300a–d according to the present invention. The material processing apparatus 300a–d includes an inductively-coupled toroidal plasma source 302a–d, as described herein, and a process chamber 304a–d for processing substrates 306a–d.

The inductively-coupled toroidal plasma source 302a–d includes a plasma chamber 308a–d having a side 309a–d that is open to the process chamber 304a–d. In one embodiment, the plasma chamber 308a–d comprises a portion of a top surface of the process chamber 304a–d. In one embodiment, the plasma chamber 308a–d comprises a removable lid that is a portion of the process chamber 304a–d.

In one embodiment, the plasma chamber 308a–d is a metallic plasma chamber, such as the metallic plasma chamber described herein in connection with FIGS. 3 though 5. The metal chambers include at least one dielectric spacer that prevents induced current flow from forming in the plasma chamber. Metal chambers are advantageous because some metals are more highly resistant to certain chemicals commonly used in plasma processing. Also, metal chambers have much higher thermal conductivity and can tolerate much higher temperatures compared with dielectric chambers. Therefore, metal chambers can be used to generate much higher power plasmas. The plasma chamber 308a–d may include imbedded cooling channels, as described herein, for passing a fluid that controls the temperature of the plasma chamber 308a–d.

Figure 7B:
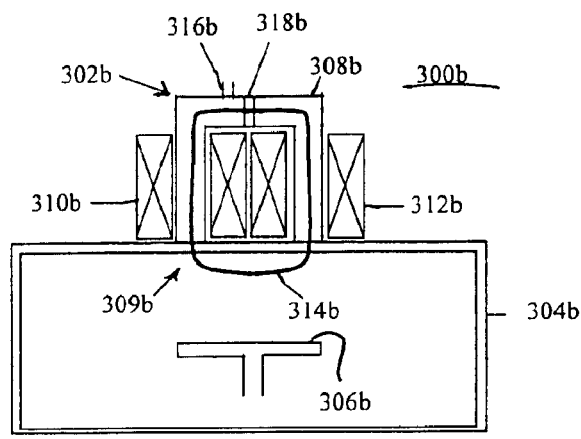

The inductively-coupled toroidal plasma source 302a–b shown in FIGS. 7a and 7b includes a first 310a–b and a second high permeability magnetic core 312a–b that surround the plasma chamber 308a–b. In other embodiments, any number of high permeability magnetic cores can be used. The magnetic cores 310a–b, 312a–b are part of the transformer 12 described in connection with FIG. 1. Each of the magnetic cores 310a–b, 312a–b induces a potential inside the chamber that forms a plasma 314a–b that completes a secondary circuit of the transformer.

Figure 7C:
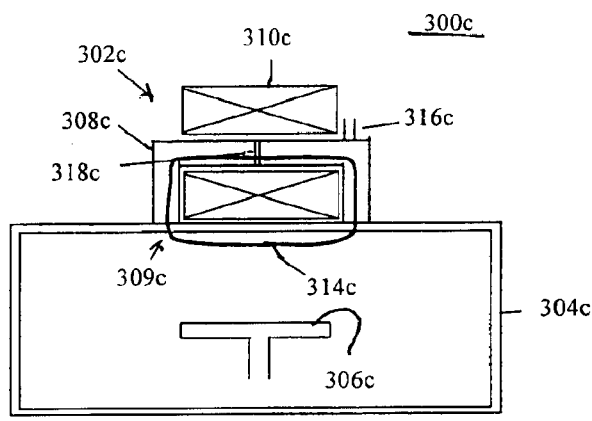
Figure 7D:
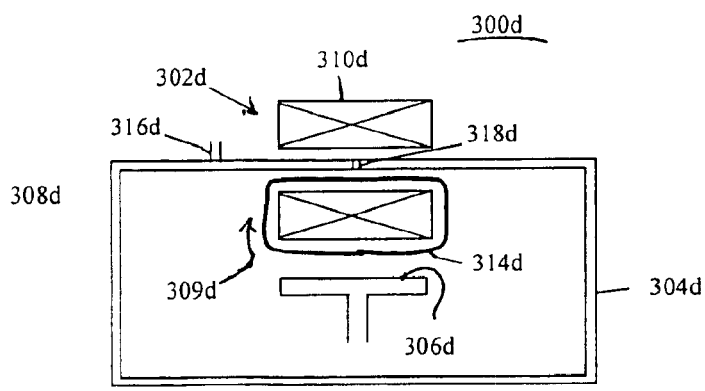

The inductively-coupled toroidal plasma sources 302c–d shown in FIGS. 7c and 7d include only one high permeability magnetic core 310c–d that surrounds the plasma chamber 308c–d. This can allow for different plasma configurations that may be optimized for other applications. This also allows for flexibility in packaging the source onto or as part of a processing chamber.

FIGS. 7d illustrates an inductively-coupled toroidal plasma source 302d having the high permeability magnetic core 310d partially located in the processing chamber 304d. Positioning the magnetic core 310d in the processing chamber 304d causes the resulting plasma 314d to extend further into process chamber 304d. This configuration is useful for providing both reactive neutral species and a plasma 314d to the substrates being processed. This configuration is also useful for providing both reactive neutral species and a plasma 314d to the process chamber 304d in order to clean the process chamber 304d.

In operation, a feed gas flows into an inlet 316a–d, as described in connection with FIG. 1. In the embodiments shown in FIGS. 7a and 7b, each of the first 310a–b and the second high permeability magnetic cores 312a–b that surround the plasma chamber 308a–b induce a potential inside the plasma chamber 304a–b that forms a plasma 314a–b which completes a secondary circuit of the transformer 12. In the embodiments shown in FIGS. 7c and 7d, the high permeability magnetic cores 310c–d that surround the plasma chamber 308c–d induce a potential inside the plasma chamber 304c–d that forms a plasma 314c–d which completes a secondary circuit of the transformer 12.

The plasma 314a–d formed in the plasma chamber 308a–d extends into the process chamber 304a–d. In one embodiment, reactive neutral species are delivered to substrates 306a–d being processed within the process chamber 304a–d. In other embodiments, reactive neutral species are delivered to the process chamber 304a–d in order to clean the process chamber 304a–d. In some of these embodiments, the material processing apparatus 300a–d is configured and operated to deliver both reactive neutral species and a plasma to substrates 306a–d being processed or to the process chamber 304a–d in order to clean the process chamber 304a–d.

Integrating the toroidal plasma source 302a–d into a surface of the process chamber 304a–d, such as a removable lid of the process chamber, has numerous advantages. One advantage is that the integrated toroidal plasma generator is more efficient and, therefore, has higher process rates or lower input gas usage requirements compared with external toroidal plasma generators. The integrated toroidal plasma generator can also be operated efficiently at higher pressures compared with the external toroidal plasma generators described herein.

The integrated toroidal plasma source has higher efficiency because the reactive neutral species generated by the source do not have to travel though an intermediate region in order to reach the interior of the process chamber, where they are used for cleaning the process chamber or for processing substrates. Passing the reactive neutral species though an intermediate region causes some of the reactive neutral species to interact with the surface of the intermediate region and become more stable species due to recombination. The recombination reduces the density of reactive neutral species and, therefore, the efficiency of the source.

Reducing the input gas flow requirements is particularly advantageous because it reduces the cost of operating the source. For some applications requiring the use of expensive process gases, such as NF3, reducing the gas flow significantly reduces the cost of operating the source. In addition, reducing the gas flow reduces the abatement requirements when using toxic gases. For example, in sources operating with NF3, atomic fluorine (F) recombines into molecular fluorine (F2) and must be removed by an abatement apparatus. Furthermore, reducing the gas flow reduces the required pumping speed and, therefore reduces the cost of the vacuum system and the associated utilities.

Another advantage of the integrated toroidal plasma source of the present invention is that the generator can be designed and configured to deliver a plasma to the process chamber, in addition to delivering a reactive neutral species to the process chamber. Thus, the integrated source can provide a combination of plasma and reactive species to the process chamber.

Another advantage of the integrated toroidal plasma generator of the present invention is that the integrated source is more compact compared with the external toroidal plasma generators. This feature makes the integrated source more suitable for compact processing systems. In addition, the integrated source may be less expensive and, therefore, reduce the overall cost of the processing system.

Equivalents

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A material processing apparatus comprising:
   a. a process chamber having a sample holder positioned inside the process chamber that supports material to be processed;
   b. a plasma chamber comprising a portion of an outer surface of the process chamber, the plasma chamber containing a gas;
   c. a transformer having a magnetic core surrounding a portion of the plasma chamber and a primary winding; and
   d. a solid state AC switching power supply comprising one or more switching semiconductor devices coupled to a voltage supply and having an output coupled to the primary winding,
      the solid state AC switching power supply driving an AC current in the primary winding, the current inducing an AC potential inside the plasma chamber that directly forms a toroidal plasma that completes a secondary circuit of the transformer and dissociates the gas, the dissociated gas flowing into the process chamber.

2. The apparatus of claim 1 wherein the plasma extends into the process chamber.

3. The apparatus of claim 1 wherein the plasma extends to the sample holder.

4. The apparatus of claim 1 wherein a portion of the magnetic core is positioned within the process chamber.

5. The apparatus of claim 1 wherein the plasma chamber comprises a portion of a top surface of the process chamber.

6. The apparatus of claim 1 wherein the plasma chamber comprises a removable lid that is a portion of the process chamber.

7. The apparatus of claim 1 wherein the one or more switching semiconductor devices comprises one or more switching transistors.

8. The apparatus of claim 1 wherein the output of the one or more switching semiconductor devices is directly coupled to the primary winding.

9. The apparatus of claim 1 wherein the plasma chamber comprises an electrically conductive material and at least one dielectric region that forms an electrical discontinuity in the plasma chamber.

10. The apparatus of claim 9 wherein the electrically conductive material comprises aluminum.

11. The apparatus of claim 10 wherein the aluminum is anodized.

12. The apparatus of claim 1 wherein the plasma chamber comprises a dielectric material.

13. The apparatus of claim 1 further comprising an electrode positioned in the plasma chamber that generates free charges that assist the ignition of the plasma in the plasma chamber.

14. The apparatus of claim 1 further comprising an electrode capacitively coupled to the plasma chamber that generates free charges that assist the ignition of the plasma in the plasma chamber.

15. The apparatus of claim 1 further comprising an ultraviolet light source optically coupled to the plasma chamber that generates free charges that assist the ignition of the plasma in the plasma chamber.

16. The apparatus of claim 1 further comprising a circuit for measuring electrical parameters associated with the primary winding and the plasma, the electrical parameters including one or more of a current driving the primary winding, a voltage across the primary winding, an average power in the primary winding, and a peak power in the primary winding.

17. The apparatus of claim 16 further comprising a power control circuit having an input coupled to an output of the circuit for measuring electrical parameters associated with the primary winding and the plasma and an output coupled to the solid state AC switching power supply, the power control circuit controlling voltage and current supplied to the primary winding.

18. The apparatus of claim 1 further comprising a power supply that is electrically coupled to the sample holder, the power supply biasing the material to be processed relative to a potential of the plasma.

19. The apparatus of claim 1 wherein the material to be processed comprises at least one of a solid, powder, and a gas.

20. The apparatus of claim 1 wherein the material to be processed comprises a semiconductor material.

21. A material processing apparatus comprising:
   a. a process chamber;
   b. a plasma chamber comprising a portion of an outer surface of the process chamber, the plasma chamber containing a gas;
   c. a transformer having a magnetic core surrounding a portion of the plasma chamber and a primary winding; and
   d. a solid state AC switching power supply comprising one or more switching semiconductor devices coupled to a voltage supply and having an output coupled to the primary winding,
      the solid state AC switching power supply driving an AC current in the primary winding, the current inducing an AC potential inside the plasma chamber that directly forms a toroidal plasma that completes a secondary circuit of the transformer and dissociates the gas, the dissociated gas flowing into the process chamber, thereby cleaning the process chamber.

22. The apparatus of claim 21 wherein a portion of the magnetic core is positioned within the process chamber.

23. The apparatus of claim 21 wherein the plasma extends into the process chamber.

24. The apparatus of claim 21 wherein the plasma chamber comprises an electrically conductive material and at least one dielectric region that forms an electrical discontinuity in the chamber.

25. The apparatus of claim 21 further comprising an electrode positioned in the chamber that generates free charges that assist the ignition of the plasma in the plasma chamber.

26. The apparatus of claim 21 further comprising an electrode capacitively coupled to the chamber that generates free charges that assist the ignition of the plasma in the plasma chamber.

27. The apparatus of claim 21 further comprising an ultraviolet light source optically coupled to the chamber that generates free charges that assist the ignition of the plasma in the plasma chamber.

28. The apparatus of claim 21 further comprising a circuit for measuring electrical parameters associated with the primary winding and the plasma, the electrical parameters including one or more of a current driving the primary winding, a voltage across the primary winding, an average power in the primary winding, and a peak power in the primary winding.

29. The apparatus of claim 28 further comprising a power control circuit having an input coupled to an output of the circuit for measuring electrical parameters associated with the primary winding and the plasma and an output coupled to the solid state AC switching power supply, the power control circuit controlling voltage and current supplied to the primary winding.

30. A method for delivering reactive species to a process chamber, the method comprising:
   a. confining a gas in a plasma chamber comprising a portion of the outer surface of the process chamber;
   b. generating a current with a solid state AC switching power supply;
   c. inducing an AC potential inside the plasma chamber by passing the current though a primary winding of a transformer having a magnetic core surrounding a portion of the chamber, the induced AC potential directly forming a toroidal plasma that completes a secondary circuit of the transformer and dissociates the gas; and
   d. directing the dissociated gas into the process chamber.

31. The method of claim 30 further comprising forming a plasma chamber comprising a portion of an outer surface of the process chamber.

32. The method of claim 30 further comprising directing the dissociated gas to material to be processed.

33. The method of claim 30 further comprising extending the plasma into the process chamber.

34. The method of claim 30 further comprising providing an initial ionization event in the plasma chamber.

35. The method of claim 34 wherein the providing of the initial ionization event in the chamber comprises applying a voltage pulse to the primary winding.

36. The method of claim 34 wherein the providing of the initial ionization event in the chamber comprises exposing the chamber to ultraviolet light.

37. The method of claim 30 wherein the gas comprises at least one of a noble gas and a reactive gas.

38. The method of claim 30 further comprising measuring electrical parameters including at least one of the current passing though the primary winding, a voltage across the primary winding, an average power in the primary winding, and a peak power in the primary winding.

39. The method of claim 30 further comprising the step of adjusting a magnitude of the current generated by the solid state AC switching power supply from the measured electrical parameters and from predetermined operating conditions.

40. The method of claim 30 wherein a pressure in the plasma chamber is substantially between 1 mtorr and 100 torr.

41. The method of claim 30 wherein an electric field of the plasma is substantially between 1–100 V/cm.

42. A method for cleaning a process chamber, the method comprising:
   a. confining a gas in a plasma chamber comprising a portion of the outer surface of the process chamber;

b. generating a current with a solid state AC switching power supply;

c. inducing an AC potential inside the plasma chamber by passing the current though a primary winding of a transformer having a magnetic core surrounding a portion of the chamber, the induced AC potential directly forming a toroidal plasma that completes a secondary circuit of the transformer and dissociates the gas; and d. directing the dissociated gas into the process chamber, thereby cleaning the process chamber.

43. The method of claim 42 wherein the reactive gas comprises at least one of an oxygen or a fluorine containing gas.

44. An apparatus for dissociating gases, the apparatus comprising:

a. a process chamber;

b. a plasma chamber comprising a portion of an outer surface of the process chamber, the plasma chamber comprising an electrically conductive material and at least one dielectric region that forms an electrical discontinuity in the plasma chamber; the plasma chamber containing a gas;

c. a transformer having a magnetic core surrounding a portion of the plasma chamber and a primary winding; and d. a solid state AC switching power supply comprising one or more switching semiconductor devices coupled to a voltage supply and having an output coupled to the primary winding, the solid state AC switching power supply driving an AC current in the primary winding, the current inducing an AC potential inside the chamber that directly forms a toroidal plasma that completes a secondary circuit of the transformer and dissociates the gas, the dissociated gas flowing into the process chamber.

45. The apparatus of claim 44 wherein the chamber comprises aluminum.

46. The apparatus of claim 44 wherein the aluminum is anodized.

47. The apparatus of claim 44 wherein the chamber comprises cooling channels for passing a fluid that controls the temperature of the chamber.

48. A method for delivering reactive species to a process chamber, the method comprising:

a. forming a plasma chamber comprising a portion of an outer surface of a process chamber;

b. confining a gas in the plasma chamber;

c. generating a current with a solid state AC switching power supply;

d. inducing an AC potential inside the plasma chamber by passing the current though a primary winding of a transformer having a magnetic core surrounding a portion of the chamber, the induced AC potential directly forming a toroidal plasma that completes a secondary circuit of the transformer and dissociates the gas; and e. directing the dissociated gas into the process chamber.

49. A method for processing substrates, the method comprising:

a. forming a plasma chamber comprising a portion of an outer surface of a process chamber;

b. confining a gas in the plasma chamber;

c. generating a current with a solid state AC switching power supply;

d. inducing an AC potential inside the plasma chamber by passing the current though a primary winding of a transformer having a magnetic core surrounding a portion of the chamber, the induced AC potential directly forming a toroidal plasma that completes a secondary circuit of the transformer and dissociates the gas; and e. directing the dissociated gas onto substrates positioned in the process chamber, thereby processing the substrates.

50. The method of claim 49 wherein the method comprises etching the substrates.

51. The method of claim 50 wherein the method comprises depositing a dielectric material onto the substrates.

* * * * *